United States Patent [19]

Jamiolkowski et al.

[11] Patent Number: 4,513,258
[45] Date of Patent: Apr. 23, 1985

[54] SINGLE INPUT OSCILLATOR CIRCUIT

[75] Inventors: Michael J. Jamiolkowski; Jules D. Campbell, Jr., both of Austin, Tex.

[73] Assignee: Motorola, Inc., Schaumburg, Ill.

[21] Appl. No.: 510,145

[22] Filed: Jul. 1, 1983

[51] Int. Cl.[3] .................. H03K 3/354; H03K 4/50
[52] U.S. Cl. .................. 331/111; 331/108 D
[58] Field of Search .................. 331/111, 108 D, 143

[56] References Cited

U.S. PATENT DOCUMENTS 3,904,988  9/1975  Hsiao .................. 331/111
4,205,279  5/1980  Beutler .................. 331/111

Primary Examiner—Siegfried H. Grimm
Attorney, Agent, or Firm—Anthony J. Sarli, Jr.; Jeffrey Van Myers; Robert Lee King

[57] ABSTRACT

A single input oscillator circuit which provides an oscillating output signal in response to the presence of an input signal is provided. A differential comparator stage having a predetermined trip point established by a reference voltage is connected between the input terminal and a set-reset latch circuit. A gain stage has an input connected to the input termial, and variable bias is derived from both the differential stage and a set-reset latch circuit for providing the output signal in response to the voltage level of the input signal. A discharge portion is connected to the input terminal to periodically couple the input terminal to a voltage potential node in response to the latch circuit.

13 Claims, 5 Drawing Figures

– PRIOR ART –

SINGLE INPUT OSCILLATOR CIRCUIT

TECHNICAL FIELD

This invention relates generally to oscillator circuits and, more particularly, to oscillator circuits having a wide operating frequency range and low current consumption.

BACKGROUND ART

Oscillator circuits vary greatly in complexity and current consumption. Typical examples of oscillator circuits are the Schmitt trigger oscillator and a timing circuit commercially available as an MC1555 from Motorola Inc. which utilizes a resistor-capacitor (RC) circuit. Known RC oscillator circuits do not always function properly over wide frequency ranges extending into the MHz range. Process, temperature and voltage variation are a few examples of sources of unstable operation at very high frequencies. Further, some oscillator circuits consume large quantities of current and have a slow self start-up. Other oscillator circuits may not be directly functional for low power supply voltages such as 1.8 volts, and some oscillators provide an output pulse of very narrow width.

SUMMARY OF THE INVENTION

It is an object of the present invention to provide an improved single input oscillator circuit.

Another object of the present invention is to provide an improved oscillator circuit having stable high frequency operation during temperature and power supply voltage variations or due to process variation.

Yet another object of the present invention is to provide an improved oscillator circuit which minimizes current consumption and has rapid self start-up.

In carrying out the above and other objects of the present invention, there is provided, in one form a single input oscillator circuit for providing an oscillating output signal in response to the presence of an input waveform at an input terminal. In a preferred form, the input waveform is created, in part, by an RC network coupled to the input terminal. A differential amplifier having a first input coupled to the input waveform and a second input coupled to a reference voltage is provided. A first output of the differential amplifier provides a signal which is proportional to the difference between the reference voltage and the input signal. A second output of the differential amplifier provides a signal which is used for biasing purposes. Reference voltage means provide the reference voltage. A gain stage with variable biasing is coupled to the input terminal and provides the oscillating output signal. Latch means are coupled to both the differential amplifier and the gain stage, for providing a latch signal which is latched at a predetermined level in response to both the differential amplifier and the gain stage. Discharge means couple the input terminal to a reference potential node in response to the output of the latch means, thereby providing oscillating circuit operation.

The above and other objects, features and advantages of the present invention will be more clearly understood from the following detailed description taken in conjunction with the accompanying drawings.

DESCRIPTION OF A PREFERRED EMBODIMENT

Figure 1A:
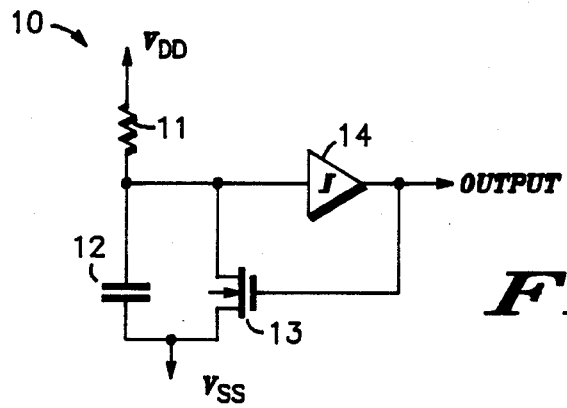
FIGS. 1(a), 1(b) and 1(c) illustrate in schematic form single input oscillator-circuits known in the art.

Shown in FIG. 1(a) is an oscillator circuit 10 known in the art and comprising a resistor 11 having a first terminal connected to a first power supply voltage $V_{DD}$ and a second terminal connected to an input terminal. A capacitor 12 has a first electrode coupled to the input terminal and a second electrode coupled to a second power supply voltage $V_{SS}$. An N-channel transistor 13 has a first current electrode coupled to the input terminal and a second current electrode coupled to the second power supply voltage $V_{SS}$. A non-inverting Schmitt trigger circuit 14 has an input coupled to the input node and an output coupled to a control electrode of transistor 13.

In operation, Schmitt trigger circuit 14 has two threshold voltage levels. When the level of the output voltage is at a logic high level, the threshold level of Schmitt trigger 14 is lower than if the level of the output voltage is a logic low level. This is accomplished by a hysteresis operation of Schmitt trigger 14. Transistor 13 functions as a discharge means of capacitor 12. Resistor 11 charges capacitor 12 until the upper threshold voltage of Schmitt trigger 14 at the input node is exceeded. At that time, the output of Schmitt trigger 14 makes transistor 13 conductive. Capacitor 12 is then discharged until the lower threshold voltage of Schmitt trigger 14 at the input terminal is reached, thereby changing the voltage level of the output of Schmitt trigger 14 to a logic low. Transistor 13 is again made nonconductive allowing capacitor 12 to recharge to the upper threshold voltage level. Oscillator circuit 10 continues to oscillate at a frequency determined by the values of resistor 11 and capacitor 12, by the conductivity of transistor 13 and by the value and variations of the threshold voltages and propagation delays of Schmitt trigger 14 due to its design.

Disadvantages with oscillator circuit 10 include the fact that the Schmitt trigger threshold voltages are not very controllable in non-complex circuits. As a result, the stability of the frequency of operation varies to a large extent because the difference between the Schmitt trigger threshold voltages vary. Further, the time to discharge the input node is primarily dependent upon the output impedance of the discharge device, transistor 13. The consequence of a short discharge time is a very narrow output pulse. Therefore, a distorted duty cycle results which is difficult to utilize without adding pulse stretching circuitry.

Figure 1B:
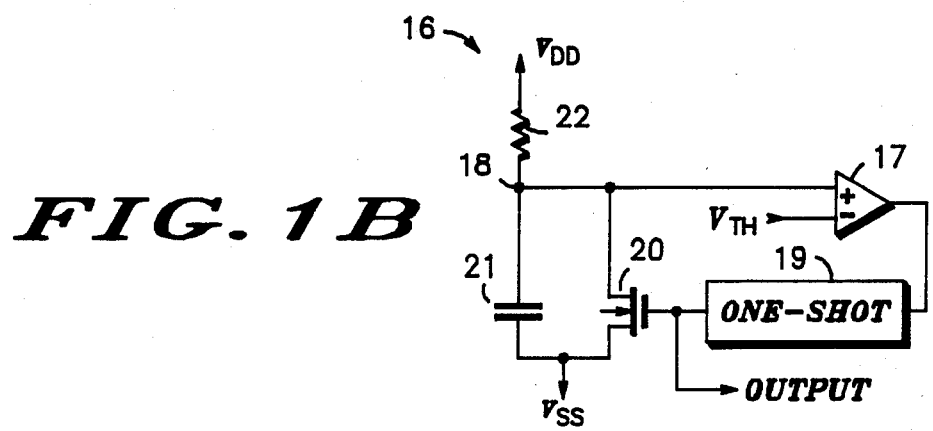

Shown in FIG. 1(b) is a time delay discharge oscillator circuit 16 which is also known in the art. A comparator circuit 17 has a noninverting input coupled to an input node 18. An inverting input of comparator 17 is coupled to a reference voltage VTH which sets the threshold voltage of comparator 17. An output of comparator 17 is coupled to a trigger input of a one-shot circuit 19. An output of one-shot circuit 19 provides an output signal and is also coupled to a control electrode of an N-channel transistor 20. A first current electrode of transistor 20 is connected to input node 18 and a second current electrode of transistor 20 is connected to a first supply voltage $V_{SS}$. A capacitor 21 has a first electrode connected to first supply voltage $V_{SS}$ and a second electrode connected to input node 18. A resistor 22 has a first terminal connected to input terminal 18 and a second terminal connected to a second supply voltage $V_{DD}$.

In operation, time delay discharge circuit 16 uses a single threshold voltage which is applied to the negative or inverting input of comparator 17. Instead of using a second threshold voltage to effect a change in the level of the output signal, comparator 17 triggers the one-shot circuit 19. The one-shot circuit 19 can provide a wider output pulse signal than the output signal of Schmitt trigger 14. However, time delay discharge oscillator circuit 16 only has one threshold voltage and the pulse width of the pulse from one-shot circuit 19 must always be sufficiently wide to discharge capacitor 21. The one-shot pulse width may vary with supply voltage, temperature and process variations. If the pulse width varies so that capacitor 21 is not totally discharged, the operating frequency becomes unstable. Although the propagation delay dependency upon the impedance of transistor 20 is minimized, a reference voltage source is required to provide reference voltage $V_{TH}$.

Figure 1C:
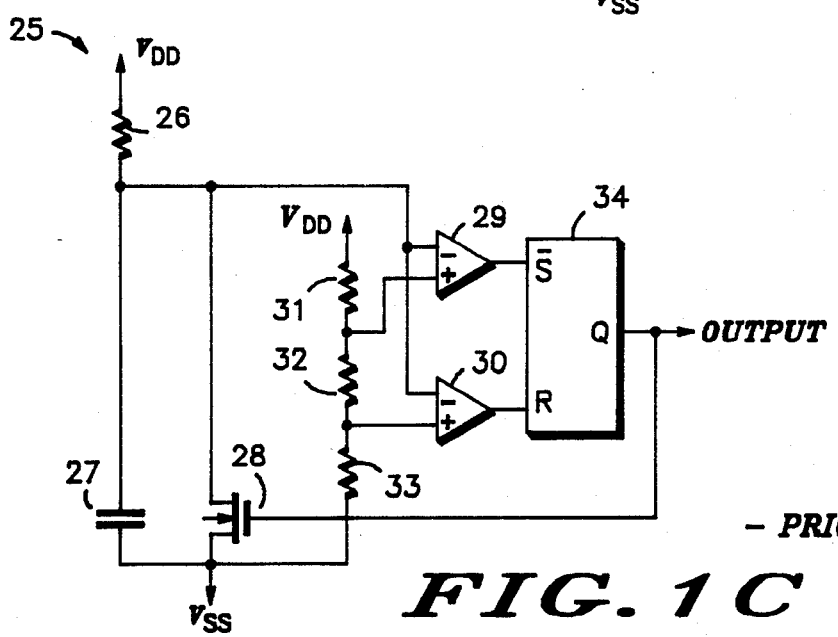

Shown in FIG. 1(c) is a CMOS circuit 25 similar to an application of a timer which is commercially available in a bipolar process as an MC1555 from Motorola Inc.. A resistor 26 has a first terminal connected to a first supply voltage $V_{DD}$. A second terminal of resistor 26 is connected to a first electrode of a capacitor 27, to a first current electrode of an N-channel discharge transistor 28 and to a negative or inverting input of both a comparator 29 and a comparator 30 via an input terminal. Both a second electrode of capacitor 27 and a second current electrode of transistor 28 are connected to a second supply voltage $V_{SS}$. A resistor 31 has a first terminal connected to a first terminal of first supply voltage $V_{DD}$ and a second terminal connected to both a positive or noninverting input of comparator 29 and a first terminal of a resistor 32. A second terminal of resistor 32 is connected to both a positive or noninverting input of comparator 30 and a first terminal of a resistor 33. A second terminal of resistor 33 is connected to second supply voltage $V_{SS}$. An output of comparator 29 is connected to a complementary set input, $\overline{S}$, of a set-reset type latch circuit 34. An output of comparator 30 is connected to a reset input, R, of latch circuit 34. An output of latch circuit 34 labeled "Q" provides an oscillating output signal and is connected to a control electrode of transistor 28.

In operation, circuit 25 utilizes two trip points by using two reference voltages, each of which is a fixed proportion of supply voltage $V_{DD}$. Use of two references voltages stabilizes the voltage difference, $\Delta V$, between the upper and lower trip points because both the current in the RC network and $\Delta V$ are proportional to supply voltage $V_{DD}$. In operation, when the voltage level at the inverting input of comparator 29 exceeds the reference voltage applied to its noninverting input, a logic zero is applied by the output of comparator 29 to the $\overline{S}$ input of latch circuit 34. Simultaneously, a logic zero input signal is coupled to the reset input, R, of latch circuit 34 by the output of comparator 30. Therefore, the Q output of latch circuit 34 is set to logic one and retains the desired output voltage level thereby enabling transistor 28. Transistor 28 discharges capacitor 27 such that the voltage to the inverting input of comparator 29 falls below the reference voltage applied to the noninverting input of comparator 29. At that time, the output of comparator 29 returns to a logic one removing the complementary set signal, $\overline{S}$, condition while the output of comparator 30 remains at logic zero. As transistor 28 discharges capacitor 27 below the reference voltage on the noninverting input of comparator 30, the output of comparator 30 transitions to logic one, thereby applying a reset signal to latch 34. The output of latch 34 returns to logic zero and renders transistor 28 nonconductive. At this time, resistor 26 begins recharging capacitor 27. It can therefore be shown that such operation repeats continuously without any coincidence of complementary set, $\overline{S}$, and reset, R, signals. Typically, an external resistor connected in series with an external capacitor is utilized. A disadvantage with circuit 25 is that discharge transistor 28 must overcome the current supplied to the first capacitor terminal via resistor 26 in order to discharge capacitor 27. Utilizing a dual threshold voltage circuit requires the resistor reference voltage string of resistors 31, 32 and 33. For low current operation, resistors 31, 32 and 33 or other voltage divider circuits require high resistance and hence excessive integrated circuit die area.

Figure 2:
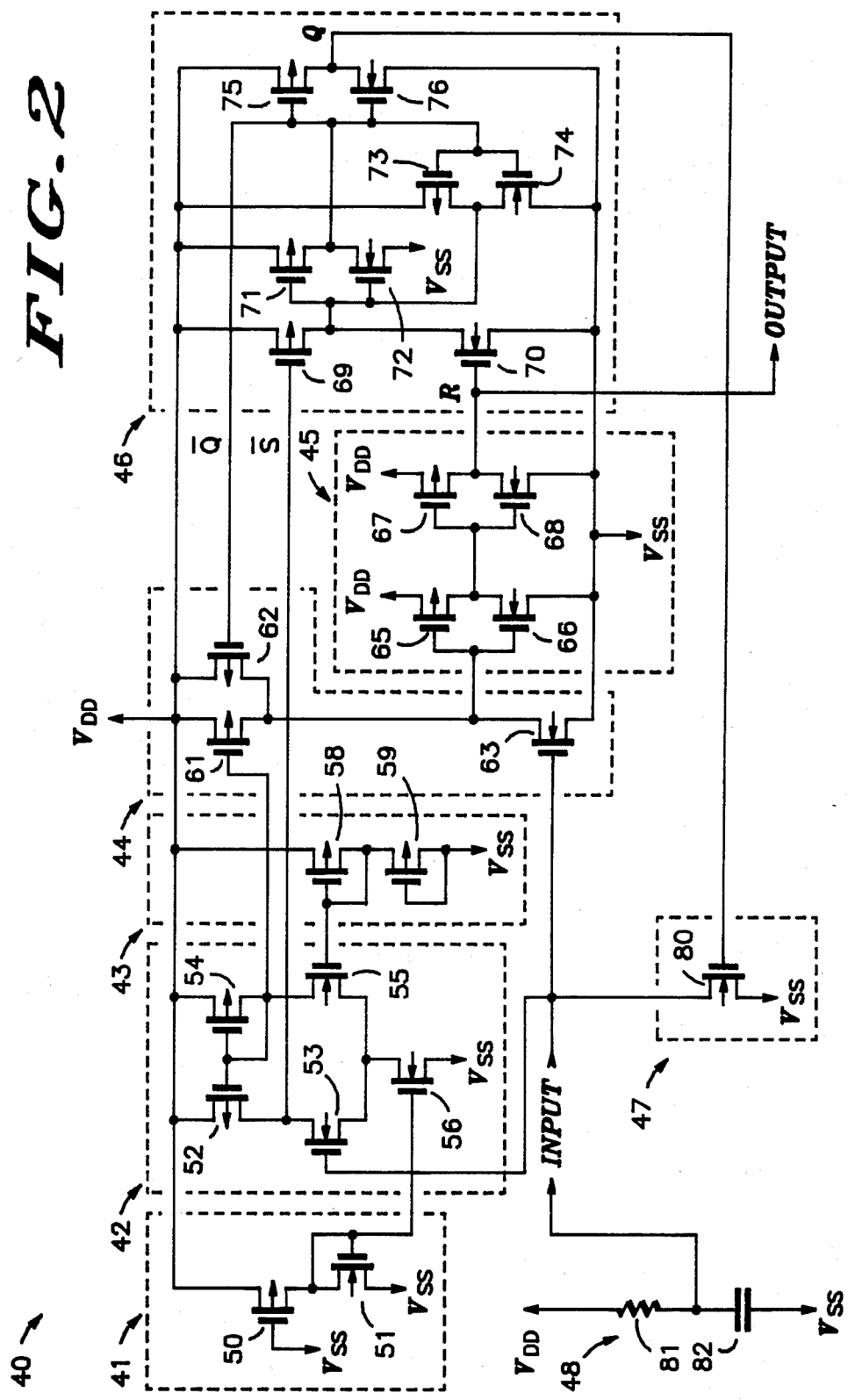
FIG. 2 illustrates in schematic form a single input oscillator circuit in accordance with a preferred embodiment of the present invention.

Shown in FIG. 2 is a preferred form of a single input oscillator circuit 40 comprising generally a bias generator portion 41, a differential amplifier portion 42, a reference voltage portion 43, a gain stage portion 44, a buffer portion 45, a latch portion 46 and a discharge portion 47. An external RC circuit 48 may be coupled to a single input terminal of circuit 40.

Bias generator portion 41 comprises a P-channel transistor 50 having a first current electrode connected to a terminal for receiving a supply voltage $V_{DD}$, a control electrode connected to a terminal for receiving a supply voltage $V_{SS}$, and a second current electrode. An N-channel transistor 51 has a first current electrode connected to both the second current electrode of transistor 50 and a control electrode thereof, and a second current electrode connected to a terminal for receiving the supply voltage $V_{SS}$.

Differential amplifier portion 42 comprises a P-channel transistor 52 having a first current electrode connected to the terminal for receiving the supply voltage $V_{DD}$, a control electrode, and a second current electrode connected to a first current electrode of an N-channel transistor 53 to form a first output. A control electrode of transistor 53 functions as a first input of differential amplifier portion 42 and is connected to a single input terminal. A P-channel transistor 54 has a first current electrode connected to the terminal for receiving supply voltage $V_{DD}$, and both a control electrode and a second current electrode connected together to form a second output of differential amplifier portion 42. The second output of differential amplifier portion 42 is connected to both the control electrode of transistor 52 and a first current electrode of an N-channel transistor 55. A second current electrode of N-channel transistor 55 is connected to both a second current electrode of N-channel transistor 53 and a first current electrode of an N-channel transistor 56. A control electrode of transistor 56 is connected to the control electrode and first current electrodes of transistor 51, and a second current electrode of transistor 56 is connected to the terminal for receiving supply voltage $V_{SS}$.

Reference voltage portion 43 comprises a P-channel transistor 58 having a first current electrode connected to supply voltage $V_{DD}$, and both a control electrode and a second current electrode connected to both a control electrode of transistor 55 and a first current electrode of a P-channel transistor 59. Transistor 59 has both a control electrode and a second current electrode connected together and to a terminal for receiving supply voltage $V_{SS}$.

Gain stage portion 44 has a P-channel transistor 61 having a first current electrode connected to the terminal for receiving supply voltage $V_{DD}$, a control electrode connected to the second output of the differential amplifier portion 42, and a second current electrode. A P-channel transistor 62 has a first current electrode connected to the terminal for receiving supply voltage $V_{DD}$, a control electrode, and a second current electrode connected to both the second current electrode of transistor 61 and a first current electrode of an N-channel transistor 63. A control electrode of transistor 63 is connected to the single input terminal of circuit 40, and a second current electrode of transistor 63 is connected to the terminal for receiving supply voltage $V_{SS}$.

Buffer portion 45 comprises a P-channel transistor 65 having a first current electrode connected to the terminal for receiving supply voltage $V_{DD}$, a control electrode connected to both a control electrode of an N-channel transistor 66 and the first current electrode of transistor 63. A second current electrode of transistor 65 is connected to a first current electrode of transistor 66, to a control electrode of a P-channel transistor 67 and to a control electrode of an N-channel transistor 68. A second current electrode of transistor 66 is connected to the terminal for receiving supply voltage $V_{SS}$. A first current electrode of transistor 67 is connected to the terminal for receiving supply voltage $V_{DD}$, and a second current electrode of transistor 67 is connected to the first current electrode of transistor 68 for providing the output of circuit 40. A second current electrode of transistor 68 is connected to the terminal for receiving supply voltage $V_{SS}$.

A latch portion 46 comprises a P-channel transistor 69 having a first current electrode connected to the terminal for receiving supply voltage $V_{DD}$, a control electrode labeled $\overline{S}$ connected to the first output of differential amplifier portion 42, and a second current electrode. An N-channel transistor 70 has a first current electrode connected to the second current electrode of transistor 69, a control electrode labeled R connected to the second current electrode of transistor 67, and a second current electrode connected to the terminal for receiving supply voltage $V_{SS}$. A P-channel transistor 71 has a first current electrode connected to the terminal for receiving supply voltage $V_{DD}$, a control electrode and a second current electrode. An N-channel transistor 72 has a first current electrode connected to the second current electrode of transistor 71 and a second current electrode connected to the terminal for receiving supply voltage $V_{SS}$. The control electrode of transistor 71 is connected to a control electrode of transistor 72, to the second current electrode of transistor 69, to a first current electrode of a P-channel transistor 73 and to a first current electrode of an N-channel transistor 74. A second current electrode of transistor 73 is connected to the terminal for receiving supply voltage $V_{DD}$, and a second current electrode of transistor 74 is connected to the terminal for receiving supply voltage $V_{SS}$. A control electrode of transistor 73 is connected to a control electrode of transistor 74 and both control electrodes are connected to a control electrode of a P-channel transistor 75, to a control electrode of an N-channel transistor 76, to the second current electrode of transistor 71, and to the control electrode of transistor 62. A first current electrode of transistor 75 is connected to the terminal for receiving supply voltage $V_{DD}$, and a second current electrode of transistor 75 which provides an output of latch portion 46 labeled "Q", is connected to a first current electrode of transistor 76. A second current electrode of transistor 76 is connected to the terminal for receiving supply voltage $V_{SS}$.

Discharge portion 47 comprises an N-channel transistor 80 having a first current electrode connected to the input terminal of circuit 40, a second current electrode connected to the terminal for receiving supply voltage $V_{SS}$, and a control electrode connected to the second current electrode of transistor 75 labeled "Q" of latch portion 46. The external RC portion 48 comprises a resistor 81 having a first terminal connected to the terminal for receiving supply voltage $V_{DD}$ and a second terminal. A capacitor 82 has a first electrode connected to the second terminal of resistor 81 and is adapted to be coupled to the single input terminal of circuit 40. A second electrode of capacitor 82 is connected to the terminal for receiving supply voltage $V_{SS}$. While specific N-channel and P-channel MOS devices are shown, it should be clear that oscillator circuit 40 could be implemented by completely reversing the processing techniques (e.g. P-channel to N-channel) or by using other types of transistors.

Figure 3:
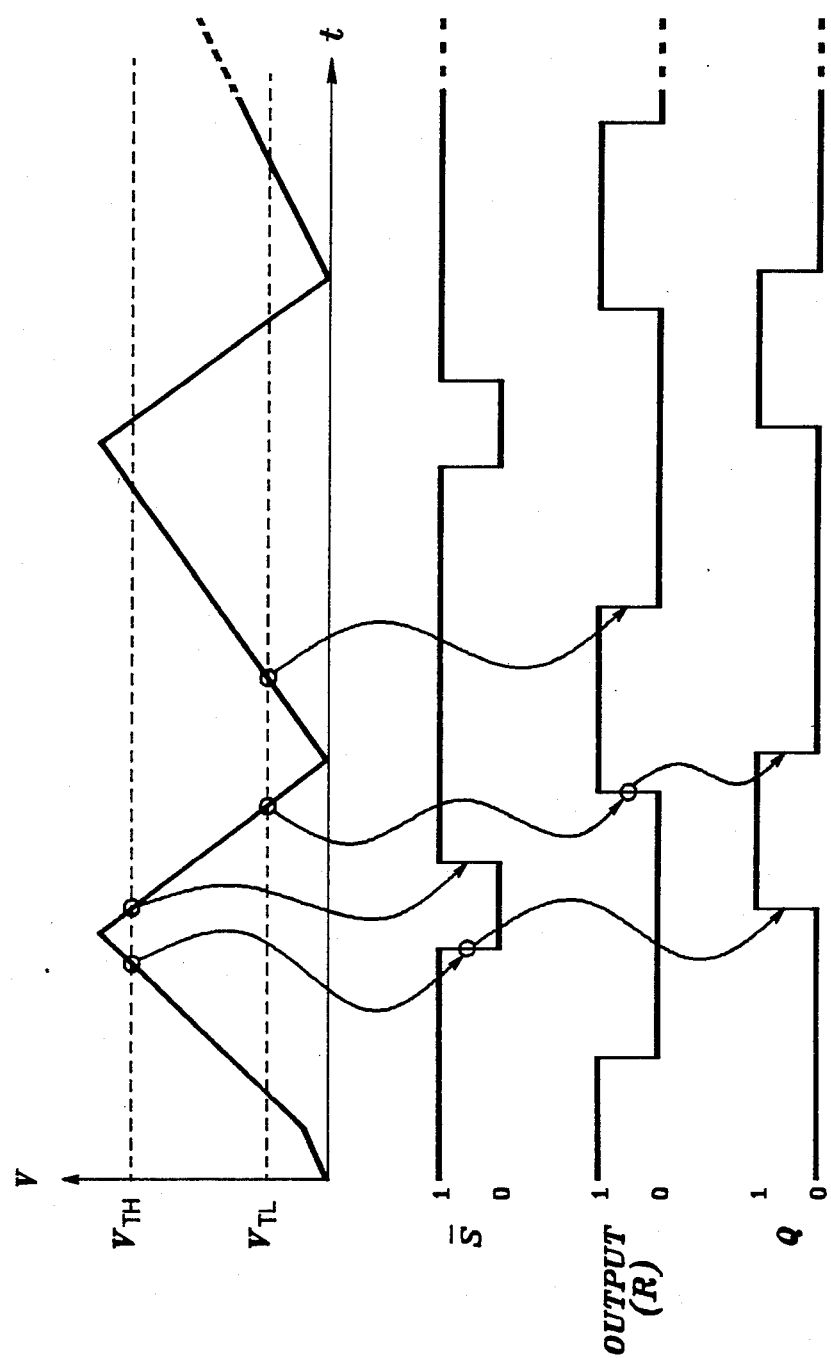
FIG. 3 illustrates in graphical form waveforms associated with the oscillator circuit of FIG. 2.

By referring to the associated signals illustrated in FIG. 3, the operation of the present invention may be readily explained. Assume that upon application of power supply voltages $V_{DD}$ and $V_{SS}$, a brief but rapid start-up time is required to establish bias currents and voltages, after which oscillator circuit 40 becomes operational. The start-up time is substantially the time required to couple full power supply voltage to circuit 40 and is very fast. Further assume, for purposes of illustration, that capacitor 82 is initially totally discharged and that resistor 81 and capacitor 82 are coupled to oscillator circuit 40 at the single input terminal. Therefore, initially both the first output of differential amplifier portion 42 and the output of gain stage 44 at the first current electrode of transistor 63 are at a logic high or one level. Therefore, the output of oscillator circuit 40 at the output of buffer portion 45 is at a logic one level thereby applying a reset condition to the set-reset latch portion 46. This causes the Q output of latch portion 46 to be at a logic zero level thereby disabling capacitor discharge transistor 80. The $\overline{Q}$ output of latch portion 46 is at a logic one level which disables transistor 62 by making transistor 62 nonconductive. This reduces the bias current in gain stage portion 44 thereby conserving power.

Simultaneously, resistor 81 charges capacitor 82 until the voltage charged across capacitor 82 reaches the threshold voltage of N-channel transistor 63, say $V_{TL}$. Once transistor 63 is made conductive, the output of gain stage portion 44 becomes a low logic level. This causes the output signal of circuit 40 and the reset signal input of latch portion 46 to transition to a low logic level as shown in FIG. 3. Resistor 81 continues to charge capacitor 82 until the threshold voltage of differential amplifier stage 42, say $V_{TH}$, is reached. Differential amplifier stage 42 functions as a comparator. The threshold voltage is determined by the voltage coupled to the second input of differential amplifier stage 42 by reference voltage portion 43. Bias generator transistors 50 and 51 provide a bias voltage to transistor 56 which functions as a regulated current source for differential amplifier stage 42. Once the voltage of capacitor 82 exceeds the threshold voltage of differential stage 42, the first output of differential stage 42 transitions to a low logic level which sets latch portion 46. A low logic level at the control electrode of transistor 69 couples a high logic level to the control electrodes of transistors 71 and 72 which couples a low logic level to the control electrodes of transistors 75 and 76. Therefore, the Q output of latch portion 46 transitions to a high logic level thereby enabling capacitor discharge transistor 80. To guarantee circuit oscillation, the impedance of transistor 80 when conductive must be considerably lower than the resistance of resistor 81. Simultanouesly, the $\overline{Q}$ output of latch portion 46 enables transistor 62 of gain stage portion 44 thereby increasing the bias current in the gain stage portion 44 and greatly improving its response time to a fast negative transition on the input of oscillator circuit 40.

After discharge transistor 80 is conductive a predetermined amount of time, capacitor 82 is discharged. When the voltage across capacitor 82 becomes less than the threshold voltage level $V_{TH}$ of differential amplifier portion 42, the first output of differential amplifier portion 42 transitions to a high logic level thereby removing the set condition of latch portion 46. As the voltage on capacitor 82 falls below the threshold voltage of transistor 63 of gain stage 44, the output of gain stage 44 at the first current electrode of transistor 63 transitions to a high logic level. Therefore, the output signal at the output of buffer portion 45 transitions from a logic low level to a logic high level and a reset condition is thus applied to latch portion 46 thereby causing the Q output to become a logic zero and the $\overline{Q}$ output to become a logic one thus initiating another oscillator cycle. Simultaneously, transistor 62 is disabled thereby conserving power.

In an analogous manner to the circuit operation previously described, if capacitor 82 is initially charged to supply voltage $V_{DD}$ rather than being discharged, differential amplifier portion 42 and gain stage portion 44 would immediately initiate a discharge phase previously described. Further, if capacitor 82 is initially charged to a voltage which is somewhere between the threshold voltage levels $V_{TH}$ and $V_{TL}$, the initial state of latch portion 46 would determine whether oscillator circuit 40 would start in a charge or discharge phase.

Although an external resistor-capacitor voltage input is shown, other embodiments of the use of oscillator circuit 40 may include applying a clock input to the single input terminal where the clock input has an amplitude which varies above and below the threshold voltage of gain stage portion 44.

Advantages of oscillator circuit 40 include the feature that a wide range of external R-C networks may be used to provide an oscillating output signal having a wide operating frequency range. Further, oscillator circuit 40 can provide a stable high frequency output signal over a range of process, temperature and voltage variations and utilizes low current consumption. The oscillator also has rapid self start-up. The output waveshape is improved by using a common source gain stage having variable bias with a differential comparator stage utilizing a single reference voltage.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A single input oscillator circuit for providing an oscillating output signal in response to the presence of an input signal, comprising:
    means for receiving an input signal;
    a differential amplifier having a first input coupled to the means for receiving the input signal, a second input coupled to a reference voltage, and first and second outputs, for providing first and second output signals which are proportional to the difference between the reference voltage and the input signal;
    reference voltage means connected to the second input for providing the reference voltage;
    a gain stage with variable bias having an input coupled to the means for receiving the input signal, a first bias control terminal coupled to the second output of the differential amplifier, a second bias control terminal, and an output for providing the oscillating output signal;
    latch means having a first input coupled to the first output of the differential amplifier, a second input coupled to the output of the gain stage, a first output coupled to the second bias control terminal, and a second output, for latching an output signal at a predetermined level in response to the level of the signals at the first and second inputs thereof; and
    discharge means coupled between the means for receiving the input signal and a reference potential node, for selectively coupling the input of the oscillator circuit to the reference potential node in response to the output of the latch means.

2. The single input oscillator circuit of claim 1 wherein said differential amplifier comprises:
    a first transistor of a first conductivity type having first and second current electrodes, and a control electrode which is connected to the means for receiving an input signal and which functions as the first input;
    a second transistor of the first conductivity type having a first current electrode, a second current electrode connected to the second current electrode of the first transistor, and a control electrode which is connected to the reference voltage means and which functions as the second input;
    a third transistor of a second conductivity type having a first current electrode for receiving a first supply voltage, a control electrode, and a second current electrode which is connected to the first current electrode of the first transistor and which functions as the first output of the differential amplifier;
    a fourth transistor of the second conductivity type having a first current electrode for receiving the first supply voltage, and both a second current electrode and a control electrode connected to the control electrode of the third transistor and to the first current electrode of the second transistor to function as the second output of the differential amplifier; and current source means connected to the second current electrodes of the first and second transistors for providing a predetermined current to the differential amplifier.

3. The single input oscillator circuit of claim 2 wherein the current source means comprise:
a fifth transistor of the first conductivity type having a first current electrode connected to the second current electrodes of the first and second transistors, a second current electrode connected to the reference potential node for receiving a second supply voltage, and a control electrode for receiving a bias voltage.

4. The single input oscillator circuit of claim 3 further comprising:
bias voltage means for providing the bias voltage to the current source means comprising:
a sixth transistor of the second conductivity type having a first current electrode for receiving the first supply voltage, a control electrode for receiving the second supply voltage, and a second current electrode;
a seventh transistor of the first conductivity type having both a first current electrode and a control electrode connected to both the second current electrode of the sixth transistor and to the control electrode of the fifth transistor, and a second current electrode for receiving the second supply voltage.

5. The single input oscillator circuit of claim 1 wherein the reference voltage means comprise:
a first transistor having a first current electrode for receiving a first supply voltage, and both a control electrode and a second current electrode connected to the second input of the differential amplifier; and
a second transistor having a first current electrode connected to the second current electrode of the first transistor, and both a control electrode and a second current electrode connected together for receiving a second supply voltage.

6. The single input oscillator circuit of claim 1 wherein the gain stage comprises:
a first transistor of a first conductivity type having a first current electrode for receiving a first supply voltage, a control electrode connected to the second output of the differential amplifier, and a second current electrode, for supplying a first bias current;
a second transistor of the first conductivity type having a first current electrode for receiving the first supply voltage, a control electrode connected to the first output of the latch means, and a second current electrode connected to the second current electrode of the first transistor, for providing a second bias current; and
a third transistor of a second conductivity type having a first current electrode connected to the second current electrodes of the first and second transistors and coupled to the second input of the latch means, a control electrode connected to the means for receiving the input signal, and a second current electrode for receiving a second supply voltage.

7. The single input oscillator circuit of claim 1 further comprising:
a buffer stage coupled between the gain stage and the latch means for amplifying the output signal, comprising:

a first inverter means having an input connected to the output of the gain stage and an output; and
a second inverter means having an input connected to the output of the first inverter means and an output connected to the second input of the latch means for providing the oscillating output signal.

8. The single input oscillator circuit of claim 1 wherein the latch means is a set-reset type latch circuit.

9. The single input oscillator circuit of claim 6 further comprising:
means for applying an input voltage of varying level at a predetermined frequency to the single input terminal of the oscillator circuit.

10. The single input oscillator circuit of claim 9 wherein the means for applying the input voltage comprise:
a resistor having a first terminal for receiving the first supply voltage and a second terminal; and
a capacitor having a first electrode connected to both the second terminal of the resistor and the single input terminal, and a second terminal for receiving the second supply voltage.

11. An oscillator circuit for providing an oscillating output signal in response to the presence of an input signal, comprising:
a differential stage having first and second inputs and first and second outputs, said first and second inputs for respectively receiving the input signal and a threshold level voltage;
reference voltage means connected to the second input of the differential stage for providing the threshold level voltage;
a gain stage with variable bias having an input connected to a single input terminal, a first bias control terminal coupled to the second output of the differential stage, a second bias control terminal, and an output;
a buffer stage having an input connected to the output of the gain stage, and an output for providing the oscillating output signal;
a set-reset latch circuit having a set input connected to the first output of the differential stage, a reset input connected to the output of the buffer stage, a first output connected to the second bias control terminal of the gain stage for varying the bias of the gain stage, and a second output for providing a latched output signal in response to the set and reset inputs; and
a discharge transistor having a first current electrode connected to the single input terminal, a control electrode connected to the second output of the set-reset latch circuit, and a second current electrode connected to a reference potential node, for selectively coupling the input terminal to the reference potential node in response to the output of the latch circuit.

12. The oscillator circuit of claim 11 further comprising:
means for applying an input signal of varying voltage level to the single input terminal.

13. The oscillator circuit of claim 12 wherein the means for applying the input signal comprise:
a resistor having a first terminal for receiving a first supply voltage, and a second terminal; and
a capacitor having a first electrode connected to both the second terminal of the resistor and the input terminal, and a second electrode for receiving a second supply voltage.

* * * * *